(12) United States Patent
Bogner

(10) Patent No.: US 10,103,049 B2
(45) Date of Patent: Oct. 16, 2018

(54) METHOD AND APPARATUS FOR PREVENTING THE DEFORMATION OF A SUBSTRATE SUPPORTED AT ITS EDGE AREA

(71) Applicant: SUSS MicroTec Lithography GmbH, Garching (DE)

(72) Inventor: Bernhard Bogner, Velden (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 0 days.

(21) Appl. No.: 15/117,930

(22) PCT Filed: Feb. 11, 2015

(86) PCT No.: PCT/EP2015/052832
§ 371 (c)(1),
(2) Date: Aug. 10, 2016

(87) PCT Pub. No.: WO2015/121284
PCT Pub. Date: Aug. 20, 2015

(65) Prior Publication Data
US 2016/0358807 A1    Dec. 8, 2016

(30) Foreign Application Priority Data

Feb. 11, 2014   (EP) ..................................... 14154614
Mar. 28, 2014   (EP) ..................................... 14162346

(51) Int. Cl.
*H01L 21/683*   (2006.01)
*B25J 15/00*    (2006.01)
*H01L 21/67*    (2006.01)

(52) U.S. Cl.
CPC ...... *H01L 21/6838* (2013.01); *B25J 15/0014* (2013.01); *H01L 21/67288* (2013.01)

(58) Field of Classification Search
CPC . H01L 21/683; B25J 11/0095; B25J 19/0091; B25J 15/0014
(Continued)

(56) References Cited

U.S. PATENT DOCUMENTS 3,438,668 A * 4/1969 Williams .............. B66C 1/0212
                                                      294/64.3
3,955,163 A * 5/1976 Novak .................... G03B 27/20
                                                       269/21
(Continued)

FOREIGN PATENT DOCUMENTS

| CN | 102082072 A | 6/2011 |
|---|---|---|
| WO | 03/024877 A1 | 3/2003 |
| WO | 2011/148548 A1 | 12/2011 |

OTHER PUBLICATIONS

European Search Report dated Mar. 5, 2015 identifying 3 reference documents (previously identified in IDS on Aug. 10, 2016).
(Continued)

*Primary Examiner* — Paul T Chin
(74) *Attorney, Agent, or Firm* — Hayes Soloway PC

(57) ABSTRACT

The method and the apparatus prevents the deformation of a substrate, e.g. a wafer, supported with its edge area or periphery at a support or chuck, and also avoids the damage and/or contamination of the active area of the substrate. In particular, the substrate is mechanically supported at its peripheral or edge portion, namely in the non-active area of the substrate, only; an additional non-mechanical extended support is provided in the active area by a gas cushion. The gas cushion is generated by a controllable nozzle or purge for a distinct and controlled compensation of the downward deflection of the substrate.

11 Claims, 4 Drawing Sheets

(58) Field of Classification Search
USPC ............. 294/183, 186, 188, 64.3; 271/97; 414/727, 737, 941, 144.1, 144.4, 144.5; 901/40
See application file for complete search history.

(56) References Cited

U.S. PATENT DOCUMENTS

| | | | | |
|---|---|---|---|---|
| 4,257,637 A * | 3/1981 | Hassan | ................ | B66C 1/0218 271/97 |
| 4,566,726 A * | 1/1986 | Correnti | ............... | B66C 1/0268 294/64.3 |
| 4,620,738 A * | 11/1986 | Schwartz | ............... | B65G 47/91 414/752.1 |
| 5,171,398 A * | 12/1992 | Miyamoto | .............. | B32B 37/10 269/21 |
| 5,492,566 A * | 2/1996 | Sumnitsch | .......... | H01L 21/6838 294/64.2 |
| 5,692,873 A * | 12/1997 | Weeks | ................ | H01L 21/6838 414/941 |
| 6,402,843 B1 * | 6/2002 | Siniaguine | ............ | B25B 11/005 269/21 |
| 6,464,795 B1 * | 10/2002 | Sherstinsky | ...... | C23C 16/45521 118/715 |
| 7,086,675 B2 * | 8/2006 | Jacobs | ................... | B65G 47/90 294/183 |
| 7,396,022 B1 * | 7/2008 | Moghadam | ........... | B23B 31/307 269/21 |
| 7,406,759 B2 * | 8/2008 | Yamamoto | ........ | H01L 21/67092 269/21 |
| 2002/0050322 A1 | 5/2002 | Kunisawa et al. | | |
| 2008/0229811 A1 | 9/2008 | Zhao et al. | | |
| 2012/0031147 A1 | 2/2012 | Arai et al. | | |

OTHER PUBLICATIONS

Office Action received in Chinese Patent Application No. 201580008065.3, Office Action dated Mar. 30, 2018, Partial English Translation of Office Action, 7 pages.

* cited by examiner

METHOD AND APPARATUS FOR PREVENTING THE DEFORMATION OF A SUBSTRATE SUPPORTED AT ITS EDGE AREA

The invention relates to a method and an apparatus for preventing the deformation of a substrate, e.g. a wafer, supported with its edge area or periphery at a support or chuck. In the following, the expressions support and chuck are used synonymously. The substrate may have any suitable shape, e.g. circular, rectangular, elliptical, square, etc.

In case of photolithography, the substrate or wafer, e.g. semiconductor wafer, which is to be exposed, is—in general—arranged on a planar support, e.g. a planar chuck and fixed by suction using a vacuum. Numerous suction apertures are essentially homogenously distributed across the planar chuck surface so that the whole surface of the substrate or wafer contacts the whole facing surface of the support or chuck.

Substrates, which have been provided already with sensible structures in the range of the active surface or area, e.g. on the back side, or which have not been pre-processed, may be damaged or contaminated by impurity particles in said active area when fixed by suction across the whole support surface; similarly, the lacquer coated on the back side of a substrate or wafer may also be damaged or contaminated.

In order to overcome this problem and to avoid the damage or contamination of the active area of the substrate, it has been proposed to support the substrate at its peripheral edge only; in this case of peripheral or edge suction with suction apertures in the peripheral area of the chuck facing the non-active peripheral area of the substrate, there is a gap between the inner (or active) area of the substrate and the inner portion of the support surface facing the substrate. In this case, however, the substrate or wafer may be deflected or bent downwardly due to the gravity and depending on its thickness, diameter and stiffness. Such deflection or downward bending may also occur due to an air cushion built-up between the substrate and a mask if the substrate should be positioned at a very small distance close to the mask. In case of photolithography, such downward bending results in an undue low structural resolution and non-uniformity, since the distance between the photomask and the substrate varies across the area to be processed.

The use of a support pin arranged in the active area does not prevent a $2^{nd}$ order bending of the substrate and, furthermore, still requires a disadvantageous mechanical contact of the active area of the substrate, although the contacted area is relatively small.

It is an object of the invention to provide a method and an apparatus for preventing the deformation of a substrate, e.g. a wafer, supported with its edge area or periphery at a support or chuck and also avoids a damage and/or contamination of the active area of the substrate. This object is achieved with the features of the claims.

The solution of the invention is based on the general idea to mechanically support the substrate at the peripheral or edge portion, in particular in the non-active area of the substrate, only and to provide an additional non-mechanical extended support in the active area by means of a gas cushion. In an example, the gas cushion is generated dynamically by means of a controllable nozzle or purge preferably arranged below the center of the substrate for a distinct and controlled compensation of the downward bending of the substrate. In particular, the gas of the gas cushion flows in radial outward directions to discharge openings close to the circumference of the substrate. This dynamic generation of the gas cushion results in a decrease of the supporting force close to the circumference of the substrate and, thus, maintains sufficient contact force between the edge of the substrate and the edge portion of the chuck. The nozzle may be supplied with different gaseous media depending on the process conditions.

According to the invention, the deflection of the substrate may be contactlessly compensated in a controlled manner; furthermore, the parallelity between the mask and the substrate to be exposed may be adjusted. A particle contamination of the back-side of the substrate can be avoided by using suitable gaseous media, preferably a clean gas, since there is no mechanical contact in the active area between the back-side of the substrate and the chuck. Furthermore, the gas cushion reduces the impact of particle contamination on the resulting product and process quality, since any unavoidable particles do not produce any upward arching due to the lack of mechanical support.

The invention further allows an upward convex bending or deflection of the substrate; such a controlled convex bending is particularly relevant in photolithography processes which require a very close distance between mask and substrate in order to avoid inclusion of air and to support discharge of air.

The compensation of the substrate deflection may be adjusted based on the properties of the substrate by means of an exchangeable nozzle of different properties and/or a controllable nozzle in order to control the size and the shape of the gas cushion.

The invention is further exemplified as follows:

The (circular) diameter or (square) edge length of the substrate or wafer may be e.g. up to 1000 mm, e.g. 50 mm to 400 mm.

The thickness of the substrate or wafer may be e.g. up to 10 mm or higher, e.g. 50 µm to 1000 µm.

The types of the substrates or wafers may be selected from any material suitable for photolithographic processes, e.g. silicon, glass, GaAs, metals, alloys, or plastics; however, the invention may also be used in case of other materials if a deflection of a substrate supported at a peripheral portion should be avoided or if a specific deflection should be created—irrespective of the processes subsequently applied to the substrate.

As explained above, any suitable gaseous medium may be used for generating the gas cushion, e.g. nitrogen, pressurized air, or clean or noble gases.

The distance between the tip of the nozzle and the target position of the substrate depends on the expected deflection of the substrate and may be e.g. 10 µm to 1000 µm.

The diameter of the nozzle aperture may be e.g. 0.1 mm to 5 mm, preferably 500 µm to 1500 µm.

Embodiments of the invention will be further described with reference to the accompanying drawings:

FIG. 1(a) is a schematic cross section of a support or chuck with a substrate or wafer according to the invention;

FIG. 1(b) schematically shows the upwardly directed force generated by the dynamic gas cushion and acting on the substrate in the system of FIG. 1(a);

Figure 1:
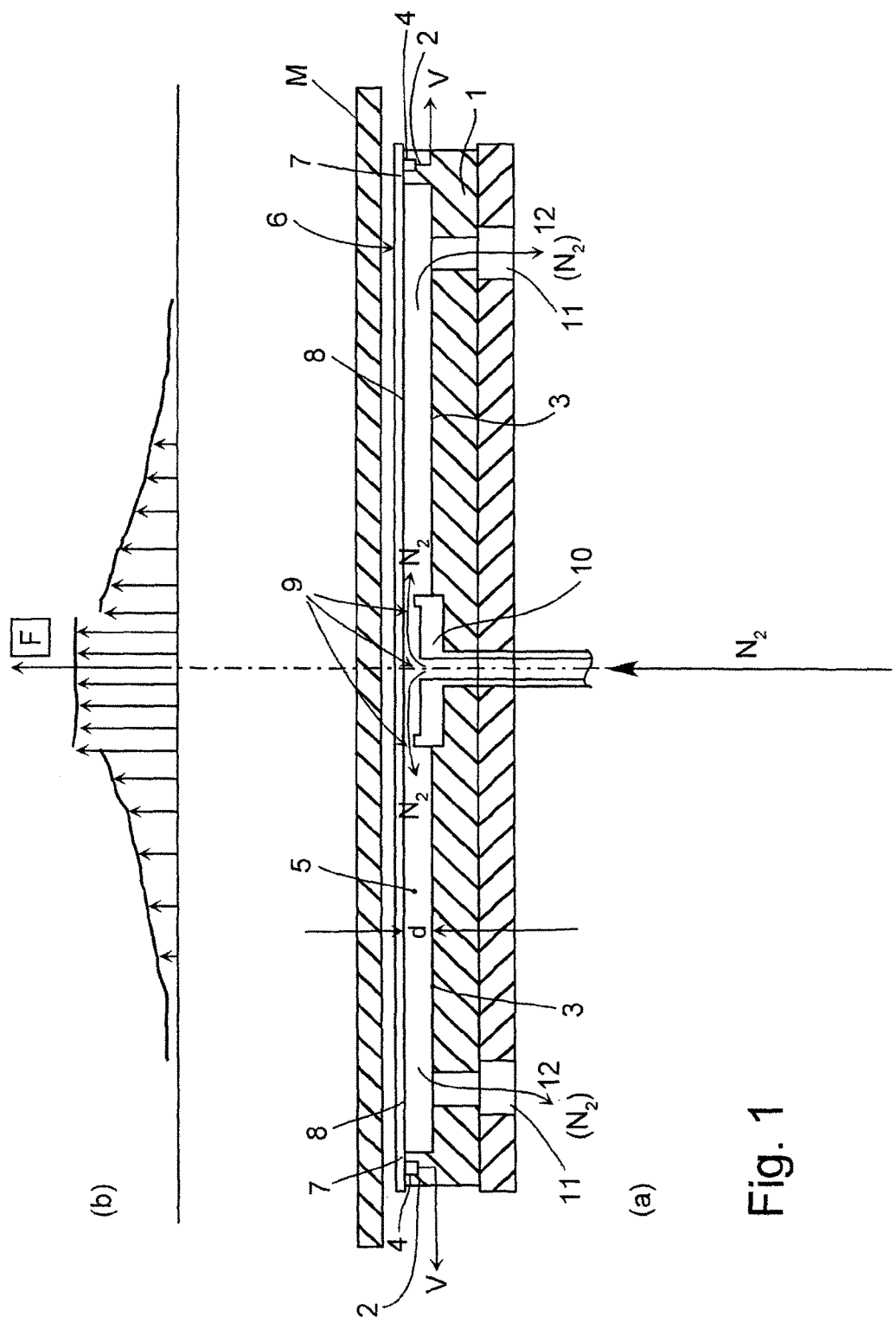

The exemplified apparatus according to the invention as shown in FIG. 1 comprises a circular support or chuck 1 having an axis A. As indicated above, alternative shapes of the chuck and the wafer are possible, e.g. circular, rectangular, elliptical, square shape, etc. In contrast to the prior art chucks, the chuck according to the invention comprises a very limited support area, namely an edge portion 2 at the periphery of the chuck. Said edge portion 2 is provided at its exposed surface facing the substrate 6 with apertures 4 connected to a vacuum source V (not shown) in order to provide a low pressure to the interface between the contact surface of the edge portion 2 and the edge area 7 of the substrate for fixing the substrate 6 to the support 1. Said peripheral edge area 7 surrounds the inner area 8 of the substrate 6 so that the surface of the inner area 8 facing the chuck does not contact the inner portion 3 of the chuck 1 and provides a gap 5. Said gap 5 has a depth d measured from the bottom of the inner portion 3 to the surface of the substrate 6 facing the chuck (corresponding to the height of the edge portions 2); said depth d may e.g. amount to about 10 μm up to several millimeters, e.g. 10 μm to 5 mm, depending on the diameter of the substrate.

FIG. 1 shows an ideally positioned planar substrate 6, i.e. the substrate is parallel to the chuck 1 and the photo mask M. Due to the weight, the size and the stiffness of the substrate 6, the substrate may—in fact—be bent or deflected downwardly so that the center of the substrate 6 around the axis A would be lower than the edge area 7 contacting the edge portion of the support 1. The apparatus of the invention, however, avoids such unwanted deflection by means of a gas cushion 9 created in the central portion of the gap between the chuck 1 and the substrate 6. Said gas cushion 9 may be provided by a nozzle or purge 10 arranged e.g. coaxially to the chuck 1 and supplying a suitable gas, e.g. nitrogen $N_2$, through the opening of the nozzle 10 towards the bottom surface of the substrate 6.

Excess gas 12 of the gas cushion 9 may be discharged to the outside via openings 11 arranged in the support 1 close to its edge portion 2; this discharge of excess gas appears necessary in order to avoid an undue attenuation of the substrate fixing at the edge portion 2 of the chuck 1. As shown in FIG. 1(b), the area radially outward from the nozzle, i.e. between the nozzle 10 and the openings 11, also contributes to the support of the substrate 6 and, thus, to the compensation of the downward deflection of the substrate 6. In particular, the upwardly directed force F acting on the substrate decreases with increasing radial distance from the nozzle 10.

The gas flow through the nozzle 10 is controlled depending on the properties of the substrate (e.g. size, thickness, weight, stiffness etc.), the desired/required shape the substrate, the dimension of the nozzle 10 (diameter of the aperture), the distance between tip of the nozzle 10 and the substrate 6, the size of the gap 5 of the chuck 1, and other relevant parameters. The gas flow schematically shown with the arrow $N_2$ may be controlled by means of an adjustable control valve (not shown) combined with a flowmeter (not shown) and a controlled gas pressure (e.g. 2 bar).

Figure 2:
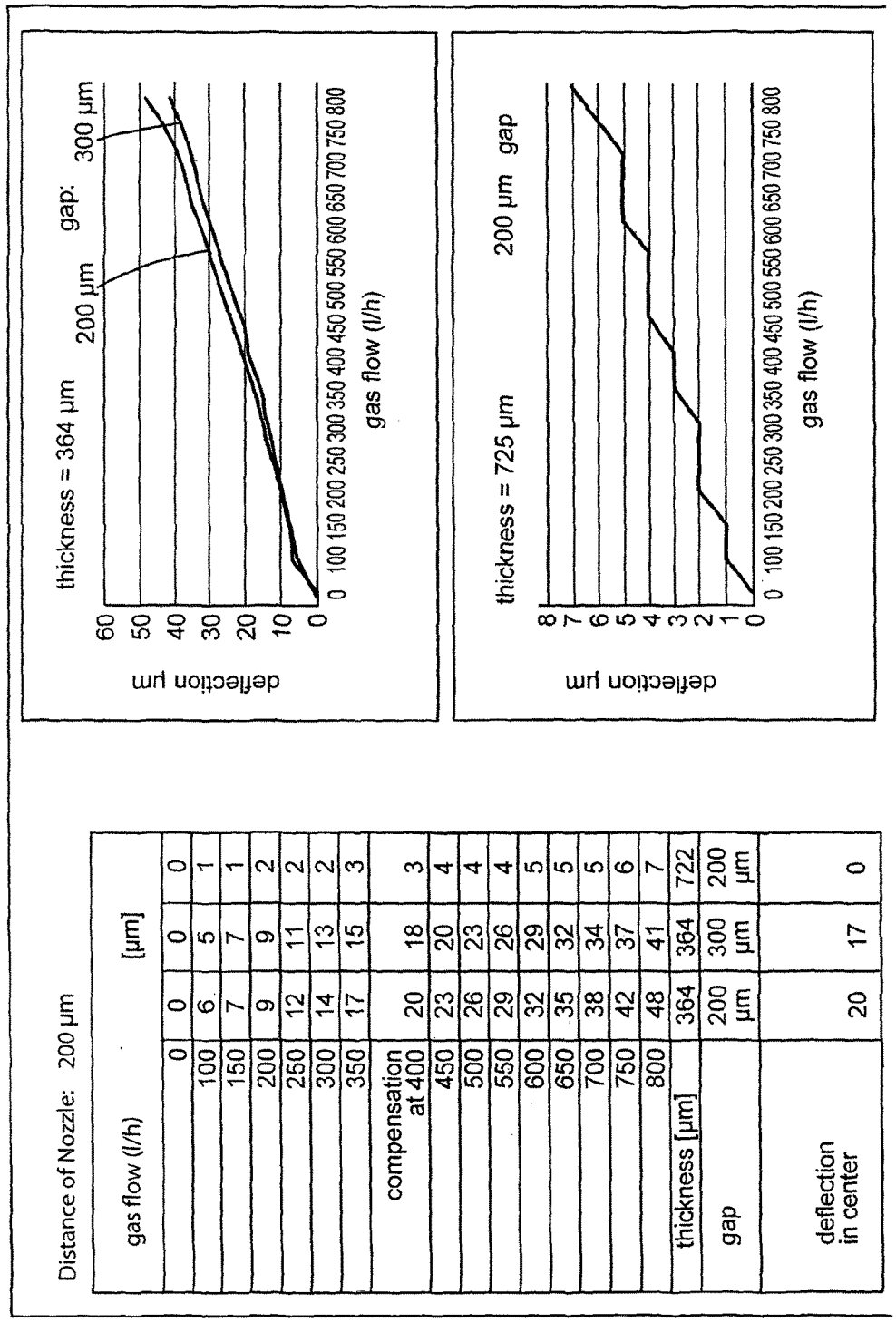
FIG. 2 shows test results of the wafer deflection depending on the gas flow for different wafer thicknesses.

FIG. 2 shows test results of the deflection in the center of the substrates depending on the gas flow (in l/min). Said substrates have a diameter of 150 mm, a thickness of 364 and 722 μm (left table in FIG. 2) and a thickness of 364 μm and 725 μm (in the diagrams at the right of FIG. 2) and with a gap of 200 or 300 μm between the tip of the nozzle and the substrate.

With a vertical distance of 200 μm between the tip of the nozzle positioned coaxial to the chuck axis A and the ideal horizontal line connecting the contact surface of the edge portion 2 of the chuck, the initial downward deflection of the substrate (thickness 360 μm) of 20 μm may be easily compensated with an $N_2$ flow of 400 l/h=6.7 l/min as shown in the left table in FIG. 2.

Figure 3:
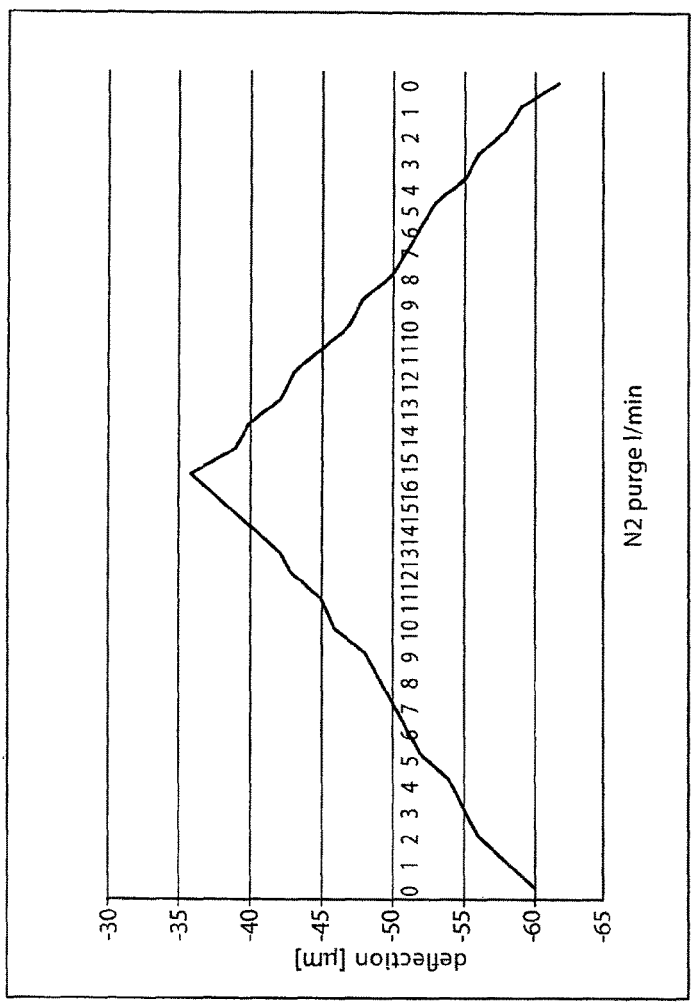
FIG. 3 shows test results of the wafer deflection depending on the gas flow.

FIG. 3 shows the test data and corresponding diagram of a controlled wafer deflection during increase and decrease of the $N_2$ gas flow form 0 liter/min up to 16 liter/min and down to 0 liter/min, i.e. the $N_2$ gas flow of 16 liter/min results in a deflection of approx. 25 μm at the center of the wafer at a nominal gap d set to 50 μm at the outer edge area 7 of the substrate 6.

Figure 4:
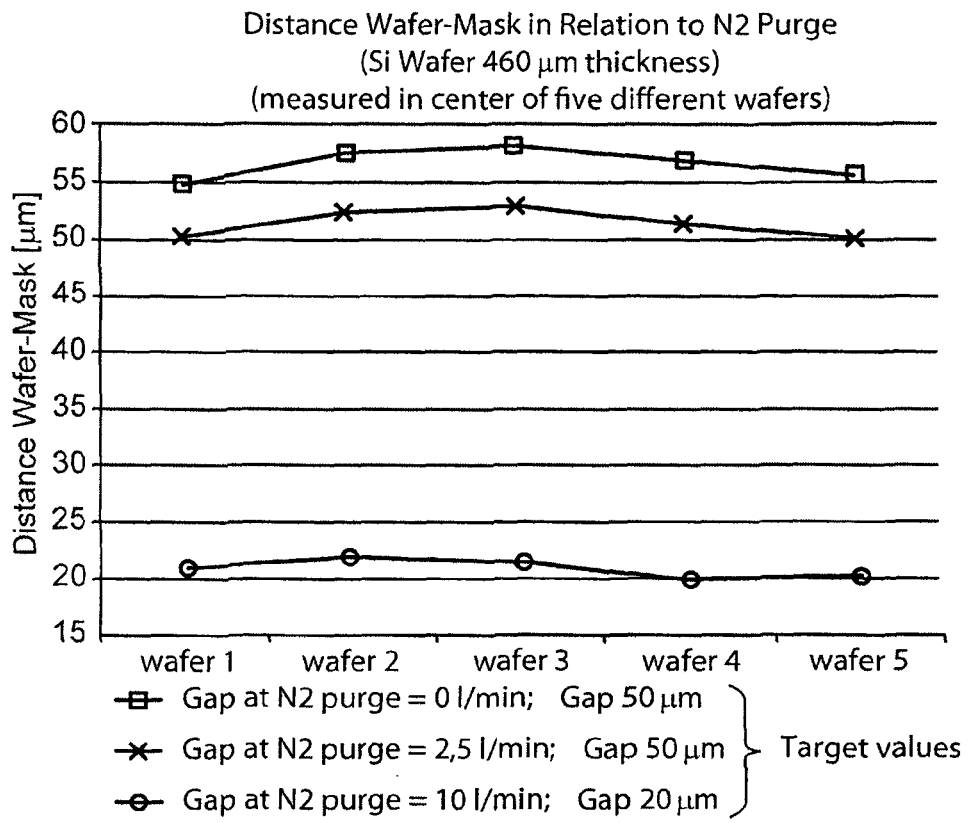
FIG. 4 shows the deflection of the substrate relative to the mask depending on the gas flow through the nozzle for different wafers.

FIG. 4 shows—for five different Si-wafers of the same thickness of 460 μm—the measured distance between the respective wafer and the mask in case of different gas flows and for two different distance settings. In case of a 50 μm target distance, the measured central distance (see "□") between mask and wafer is approximately 5 μm higher (i.e. 55 to 58 μm) with no gas flow than with a gas flow of 2.5 l/min (i.e. distance 50 to 53 μm) see "x". In case of a 20 μm target distance, the measured central distance between mask and the wafers ranges between 20 μm and 22 μm (see "○").

Figure 5:
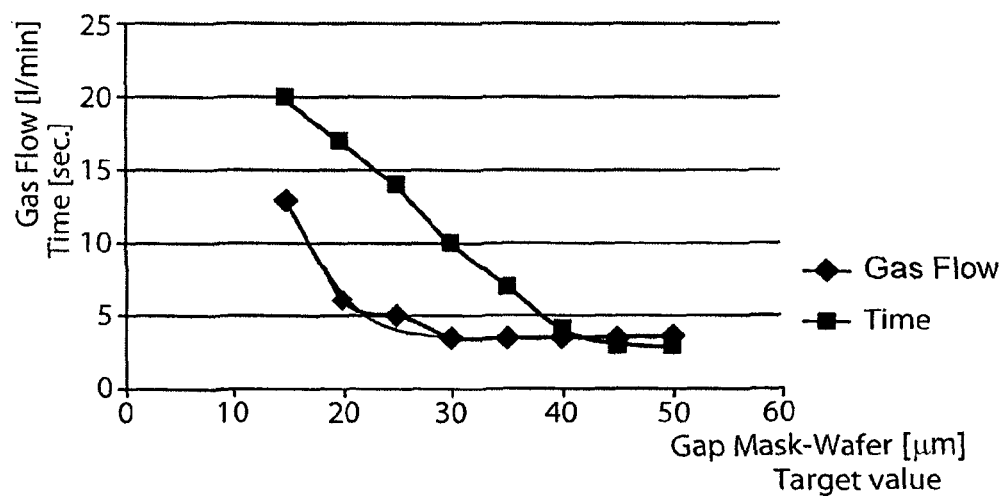
FIG. 5 shows the required time for adjusting the correct distance between mask and wafer depending on the target distance; additionally, the minimum gas flow is shown which is required for reaching the final (target) distance.

FIG. 5 shows that the time required for the adjustment of the correct distance (target distance) between mask and wafer (thickness in this exemplified case: 460 μm) depends of the said distance, namely said required time is longer in case of smaller distances due to the slower outflow of air between the wafer and the mask. Additionally, FIG. 5 shows that for a given wafer, a lower target distance between mask and wafer requires a higher gas flow. In both cases the actual distance between mask and wafer is measured in the center of the wafer.

The apparatus as described above has a circular cross section. According to the invention, the shape of the chuck or support may be different and may have any shape depending on the requirements in order to comply with the shape of the substrate or wafer, i.e. the support may be rectangular, squared, elliptical etc.

While the invention has been illustrated and described in detail in the drawings and foregoing description, such illustration and description are to be considered illustrative or exemplary and non-restrictive. The invention is thus not limited to the disclosed embodiments. Variations to the disclosed embodiments can be understood and effected by those skilled in the art and practicing the claimed invention, from a study of the drawings, the disclosure, and the appended claims. In the claims, the word 'comprising' does not exclude other elements or steps, and the indefinite article 'a' or 'an' does not exclude a plurality. A single processor or other unit may fulfill the functions of several items recited in the claims. The mere fact that certain measures are recited in mutually different dependent claims does not indicate that a combination of these measures cannot be used to advantage.

The invention claimed is:

1. A method for supporting a substrate on a support, said method comprising:

providing a support having an edge portion and an inner portion;

placing a substrate having an inner area and an edge area surrounding the inner area on said support, wherein the edge area of the substrate is in contact with the edge portion of the support and the inner portion of the support faces the inner area of the substrate and is not in mechanical contact with the substrate; and generating a gas cushion between the inner portion of the support and the substrate, wherein the gas cushion is generated by means of a controllable nozzle supplied with a gas, a gas flow through the nozzle being controlled depending on a property selected from the group consisting of a desired or required shape of the substrate, a dimension of the nozzle, a distance between a tip of the nozzle and the substrate, and a size of a gap of the support, and wherein the gas cushion deflects the substrate in a controlled manner, wherein the controlled manner is selected from the group consisting of contactlessly compensating a downward bending and creating an upward convex bending.

2. The method of claim 1, wherein contact between the edge area of the substrate and the edge portion of the support is provided by means of vacuum suction.

3. The method of claim 1, wherein the gas cushion is arranged coaxially to at least one of the support and the substrate.

4. The method of claim 1, wherein excess gas from the gas cushion is discharged from the support via openings.

5. The method of claim 1, wherein an upward directed force generated by gas of the gas cushion and acting on a downward facing surface of the substrate decreases from a location of the nozzle towards the edge portion of the support and contributes to compensation of a downward deflection of the substrate.

6. An apparatus for performing the method of claim 1, the apparatus comprising the support, wherein the inner portion of the support is lower than an upper surface of the edge portion of the support and the apparatus further comprises means for providing the gas cushion between the inner portion of the support and the inner area of the substrate, wherein the gas cushion deflects the substrate in a controlled manner, wherein the controlled manner is selected from the group consisting of contactlessly compensating a downward bending and creating an upward convex bending.

7. The apparatus of claim 6, wherein the means for providing the gas cushion is arranged coaxially to at least one of the support and the substrate.

8. The apparatus of claim 6, wherein the edge portion of the support comprises apertures connected to a vacuum means for vacuum suction of the edge area of the substrate to the edge portion of the support.

9. The apparatus of claim 6, wherein the support further comprises openings arranged therein for discharging excess gas from the gas cushion.

10. The apparatus of claim 9, wherein the openings for discharging excess gas are arranged close to the edge portion of the support.

11. A method for supporting a substrate on a support, said method comprising:

providing a support having an edge portion and an inner portion;

placing a substrate having an inner area and an edge area surrounding the inner area on said support, wherein the edge area of the substrate is in contact with the edge portion of the support and the inner portion of the support faces the inner area of the substrate and is not in mechanical contact with the substrate, wherein a downward bending of the substrate occurs due to a feature selected from the group consisting of gravity and an air cushion built-up between the substrate and a mask; and generating a gas cushion between the inner portion of the support and the substrate, wherein the gas cushion is generated by means of a controllable nozzle supplied with a gas and gas flow through the nozzle is controlled depending on a property selected from the group consisting of a desired or required shape of the substrate, one or more dimensions of the nozzle, a distance between a tip of the nozzle and the substrate, and a size of a gap of the support, wherein the gas cushion deflects the substrate in a controlled manner, wherein the controlled manner is selected from the group consisting of contactlessly compensating a downward bending and creating an upward convex bending.

* * * * *